(12) United States Patent
Gu et al.

(10) Patent No.: US 11,545,575 B2
(45) Date of Patent: Jan. 3, 2023

(54) IC STRUCTURE WITH FIN HAVING SUBFIN EXTENTS WITH DIFFERENT LATERAL DIMENSIONS

(71) Applicant: GLOBALFOUNDRIES U.S. Inc., Santa Clara, CA (US)

(72) Inventors: Man Gu, Malta, NY (US); Wenjun Li, Malta, NY (US); Sudarshan Narayanan, San Jose, CA (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 214 days.

(21) Appl. No.: 16/919,225

(22) Filed: Jul. 2, 2020

(65) Prior Publication Data
US 2022/0005954 A1 Jan. 6, 2022

(51) Int. Cl.
| H01L 29/78 | (2006.01) |
| H01L 29/66 | (2006.01) |
| H01L 29/423 | (2006.01) |
| H01L 21/762 | (2006.01) |
| H01L 21/8234 | (2006.01) |
| H01L 21/8238 | (2006.01) |

(52) U.S. Cl.
CPC .... *H01L 29/7854* (2013.01); *H01L 21/76224* (2013.01); *H01L 21/76232* (2013.01); *H01L 21/823481* (2013.01); *H01L 21/823878* (2013.01); *H01L 29/42328* (2013.01); *H01L 29/66681* (2013.01); *H01L 29/66795* (2013.01); *H01L 29/7816* (2013.01)

(58) Field of Classification Search
CPC .............. H01L 29/7816; H01L 29/785; H01L 29/66795; H01L 21/823431; H01L 21/823481; H01L 27/0886; H01L 21/76224; H01L 21/76232; H01L 29/66681; H01L 21/76; H01L 21/762
See application file for complete search history.

(56) References Cited

U.S. PATENT DOCUMENTS

| 6,876,035 | B2 * | 4/2005 | Abadeer ............. H01L 29/0653 257/493 |
| 6,921,963 | B2 | 7/2005 | Krivokapic et al. |
| 7,612,405 | B2 | 11/2009 | Yu et al. |
| 8,748,993 | B2 | 6/2014 | Lee et al. |
| 8,940,602 | B2 * | 1/2015 | Basker .............. H01L 29/66795 438/176 |

(Continued)

*Primary Examiner* — Tuan A Hoang
(74) *Attorney, Agent, or Firm* — Anthony Canale; Hoffman Warnick LLC

(57) ABSTRACT

An integrated circuit (IC) structure includes a semiconductor fin having a first longitudinal extent and a second longitudinal extent. The semiconductor fin has an upper fin portion having a uniform lateral dimension in the first longitudinal extent and the second longitudinal extent, a first subfin portion under the upper fin portion in the first longitudinal extent having a first lateral dimension, and a second subfin portion under the upper fin portion in the second longitudinal extent having a second lateral dimension different than the first lateral dimension. The second subfin may be used in a drain extension region of a laterally-diffused metal-oxide semiconductor (LDMOS) device. The second subfin reduces subfin current and improves HCI reliability, regardless of the type of LDMOS device.

20 Claims, 5 Drawing Sheets

(56) References Cited

U.S. PATENT DOCUMENTS

| | | |
|---|---|---|
| 9,082,851 B2 | 7/2015 | Ramachandran et al. |
| 10,049,942 B2 | 8/2018 | Chou et al. |
| 2009/0057780 A1 | 3/2009 | Wong et al. |
| 2014/0035043 A1 | 2/2014 | Lee et al. |
| 2015/0035053 A1 | 2/2015 | Singh |
| 2015/0200252 A1* | 7/2015 | Ching ................. H01L 29/0649 438/435 |
| 2016/0027775 A1 | 1/2016 | Akarvardar et al. |
| 2016/0225896 A1* | 8/2016 | Yoo .................... H01L 29/7848 |
| 2017/0229570 A1* | 8/2017 | Cheng ................ H01L 29/7835 |
| 2018/0108755 A1 | 4/2018 | Liu et al. |
| 2019/0140054 A1 | 5/2019 | Dewey et al. |

\* cited by examiner

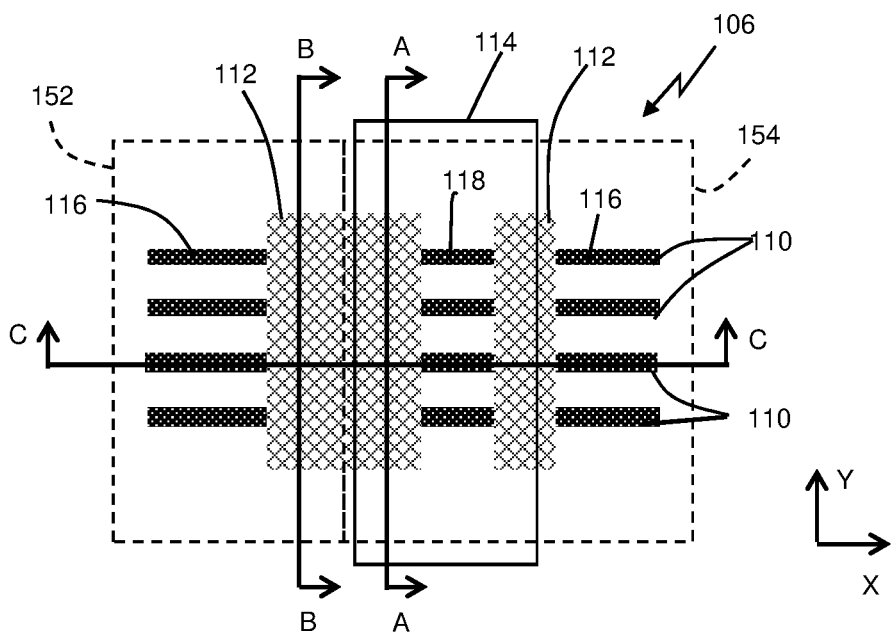
FIG. 1
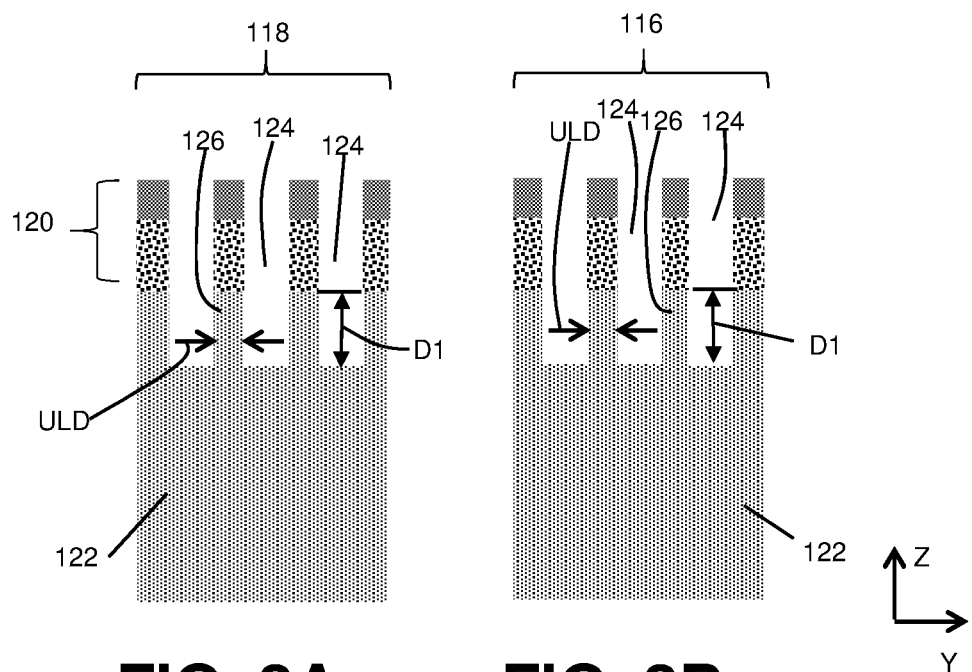
FIG. 2A   FIG. 2B

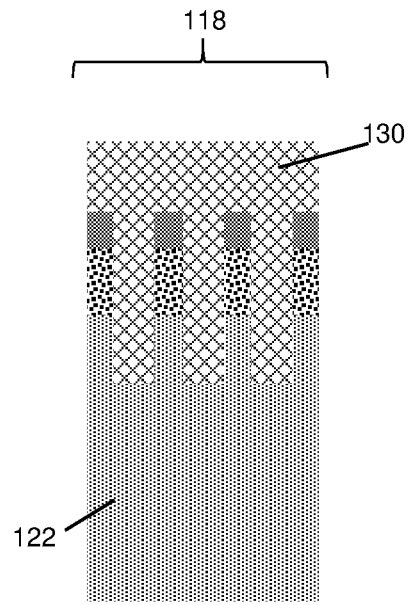
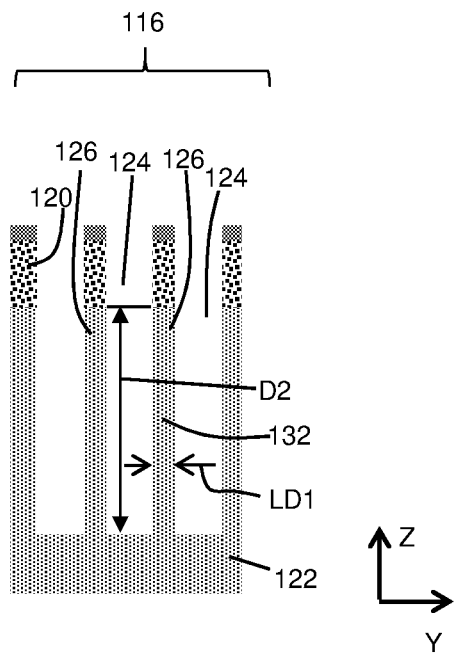
FIG. 3A  FIG. 3B
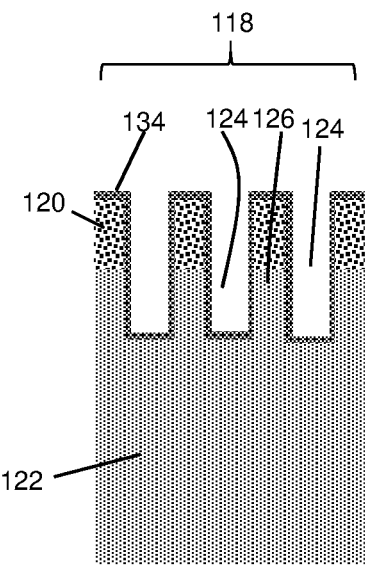
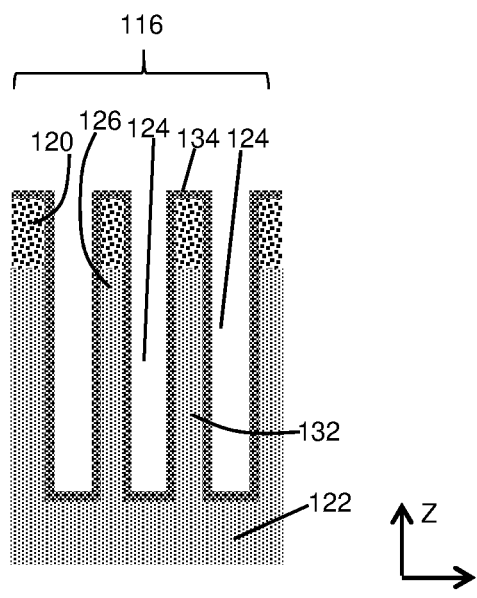
FIG. 4A  FIG. 4B

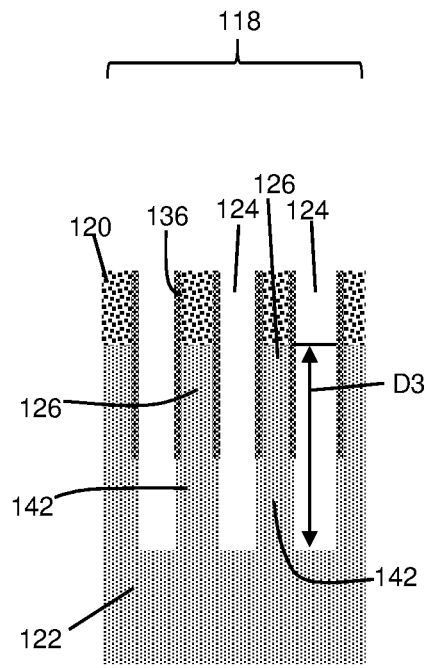
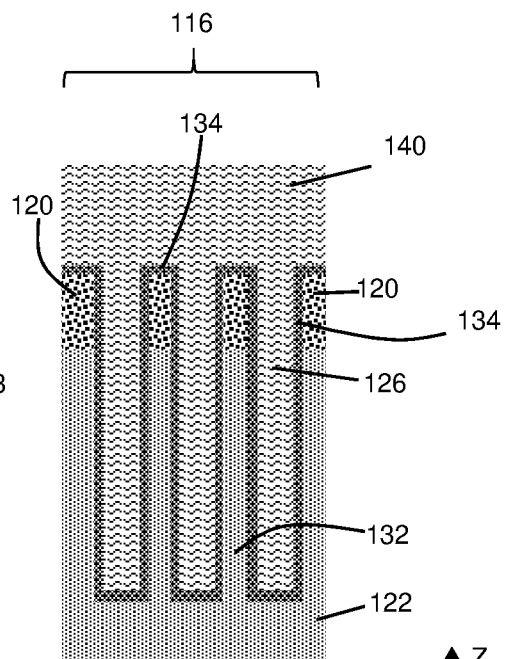
FIG. 5A  FIG. 5B
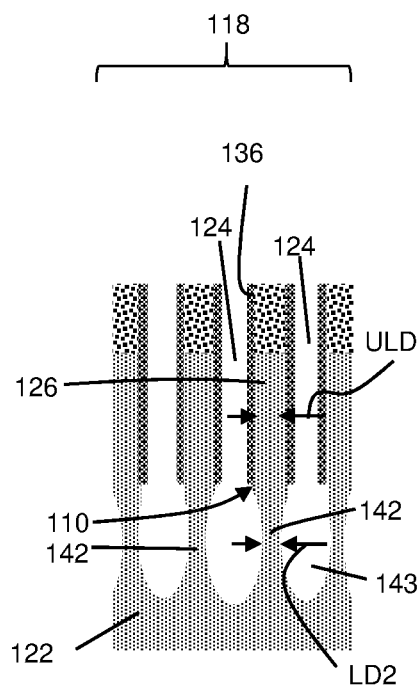
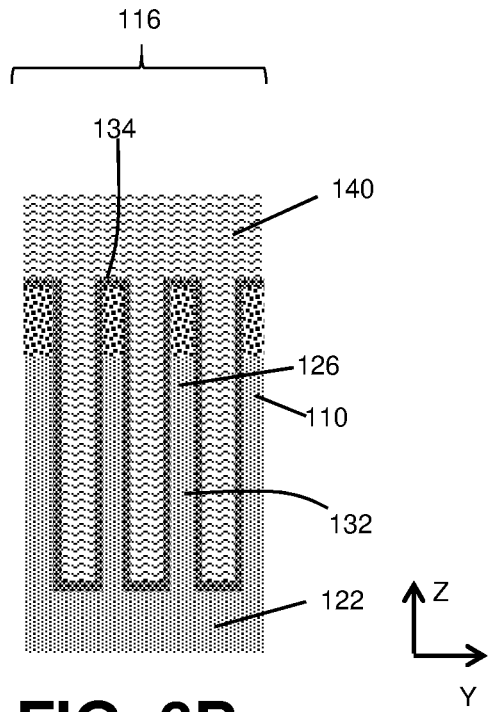
FIG. 6A  FIG. 6B

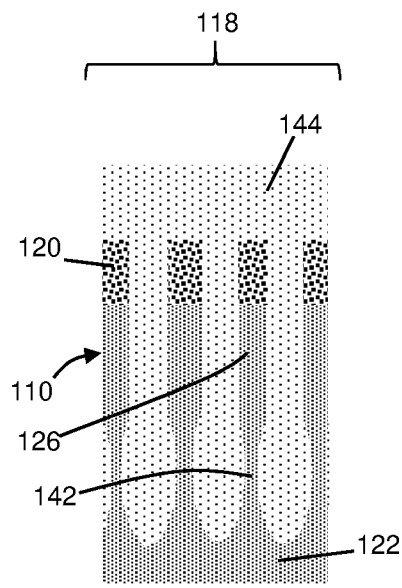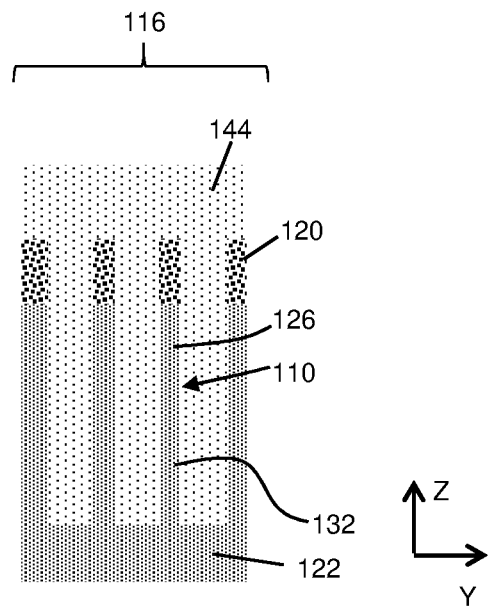
FIG. 7A   FIG. 7B
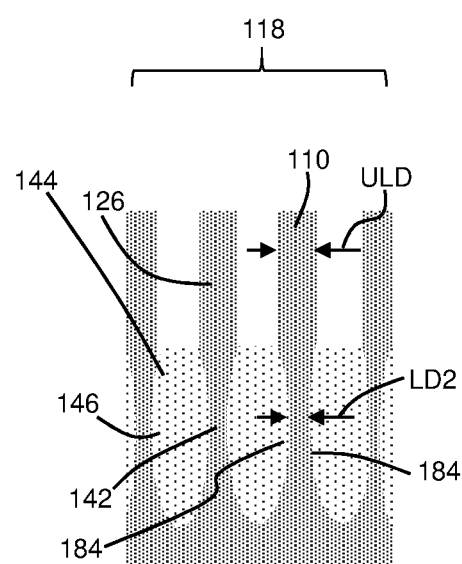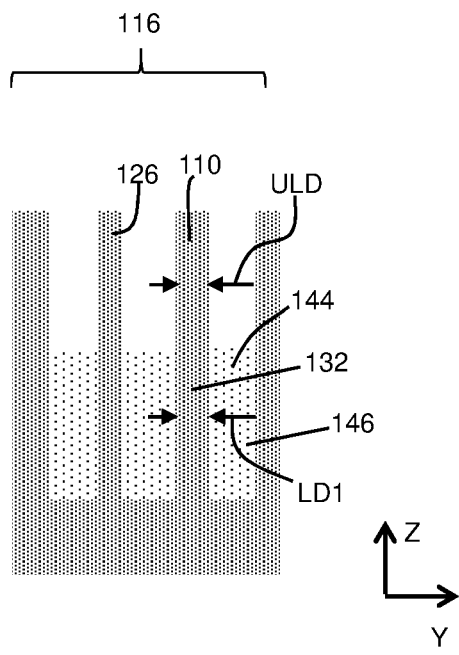
FIG. 8A   FIG. 8B

IC STRUCTURE WITH FIN HAVING SUBFIN EXTENTS WITH DIFFERENT LATERAL DIMENSIONS

BACKGROUND

The present disclosure relates to power amplifier devices, and more specifically, to an integrated circuit (IC) structure having a semiconductor fin with different longitudinal extents of subfins with different lateral dimensions.

Radio frequency (RF) devices employ laterally diffused metal-oxide semiconductor (LDMOS) devices. LDMOS devices include, within a semiconductor fin, a p-well with a source region therein and an n-well with a drain region therein. A gate extends over the p-well and n-well with the channel in the p-well and a drain extension region in the n-well. LDMOS devices come in a number of different forms. For example, LDMOS shallow trench isolation (LDMOS-STI) devices include a shallow trench isolation (STI) within the drain extension region in the n-well of the device, and LDMOS dummy gate (LDMOS-DP) devices have the n-well without the STI, but include a second, floating (dummy) gate over the drain extension region in the n-well of the device.

LDMOS FinFETs are being employed, for example, as wireless network power amplifiers with 3.3-5 Volt power. One challenge with these devices is controlling hot carrier injection (HCI). HCI is a situation in electronic devices where an electron (hole) gains enough energy to overcome a barrier required to break an interface state. In LDMOS FinFET devices, charge carriers can become trapped in a subfin portion region of the fin below the gate of the transistor and adjacent trench isolations between adjacent fins. The trapped charged carriers can create too much current in the drain extension region and can permanently alter operational characteristics (e.g., switching) of the device. Consequently, HCI presents a challenge to the performance and reliability of the devices. Current approaches attempt to improve HCI reliability by providing various implants or local trench isolations to reduce the subfin current. These approaches are complicated to implement, and may not fully address the issue for all types of LDMOS FinFET devices.

SUMMARY

An aspect of the disclosure is directed to an integrated circuit (IC) structure, including: a semiconductor fin having a first longitudinal extent and a second longitudinal extent, the semiconductor fin having: an upper fin portion having a uniform lateral dimension in the first longitudinal extent and the second longitudinal extent, a first subfin portion under the upper fin portion in the first longitudinal extent having a first lateral dimension, and a second subfin portion under the upper fin portion in the second longitudinal extent having a second lateral dimension different than the first lateral dimension.

Another aspect of the disclosure includes a fin-type field effect transistor (FinFET) laterally-diffused metal-oxide semiconductor (LDMOS) device, including: a semiconductor fin having a first longitudinal extent and a second longitudinal extent, the semiconductor fin having: an upper fin portion having a uniform lateral dimension in the first longitudinal extent and the second longitudinal extent, a first subfin portion under the upper fin portion in the first longitudinal extent having a first lateral dimension, and a second subfin portion under the upper fin portion in the second longitudinal extent having a second lateral dimension different than the first lateral dimension; a p-well in part of the first longitudinal extent; an n-well in at least the second longitudinal extent; a source region in the p-well; a drain region in the n-well; a drain extension region in the n-well, wherein the second subfin portion is within the drain extension region; and a first gate structure extends over the p-well and n-well.

Another aspect of the disclosure relates to a method, including: forming a semiconductor fin having a first longitudinal extent and a second longitudinal extent, the semiconductor fin having: an upper fin portion having a uniform lateral dimension in the first longitudinal extent and the second longitudinal extent, a first subfin portion under the upper fin portion in the first longitudinal extent having a first lateral dimension, and a second subfin portion under the upper fin portion in the second longitudinal extent having a second lateral dimension different than the first lateral dimension; and forming a gate structure over the semiconductor fin.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 1 shows a schematic plan view of a general layout of an IC structure for the purposes of describing embodiments of the disclosure.

FIGS. 2A-2B show cross-sectional views of forming a pair of trenches in a semiconductor substrate, according to embodiments of the disclosure.

FIGS. 3A-3B show cross-sectional views of forming a subfin portion in a first longitudinal extent of a semiconductor fin, according to embodiments of the disclosure.

FIGS. 4A-4B show cross-sectional views of forming a spacer layer in first and second longitudinal extents of a semiconductor fin, according to embodiments of the disclosure.

FIGS. 5A-5B show cross-sectional views of a first etching for forming a second subfin portion in a second longitudinal extent of the semiconductor fin, according to embodiments of the disclosure.

FIGS. 6A-6B show cross-sectional views of a second etching for forming the second subfin portion in the second longitudinal extent of the semiconductor fin, according to embodiments of the disclosure.

FIGS. 7A-7B show cross-sectional views of a forming a dielectric about the semiconductor fin in the first and second longitudinal extents of the semiconductor fin, according to embodiments of the disclosure.

FIGS. 8A-8B show cross-sectional views of planarizing and recessing the semiconductor fin, according to embodiments of the disclosure.

Figure 9:
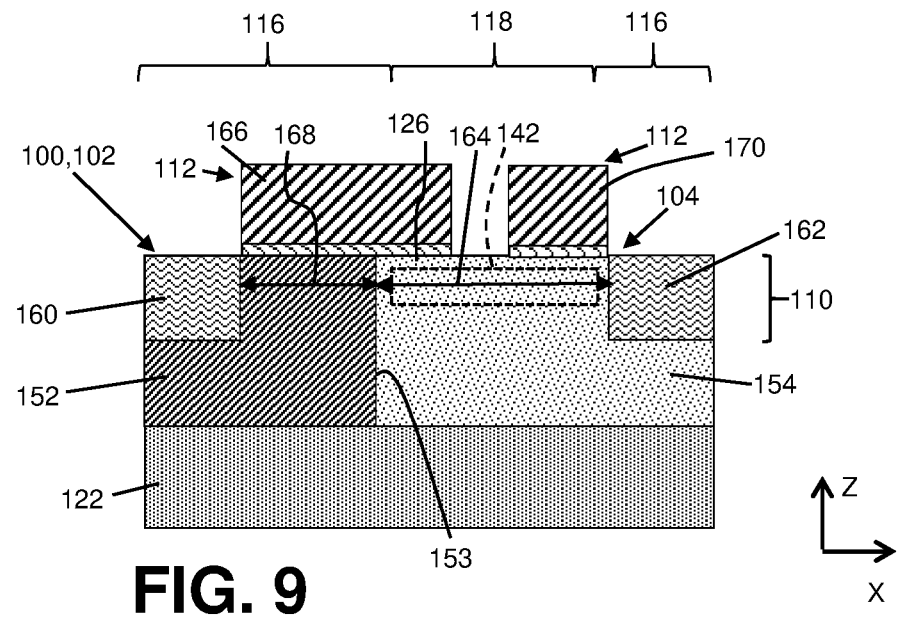
FIG. 9 shows a cross-sectional view of an IC structure, FinFET and LDMOS device, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide an integrated circuit (IC) structure for use in, for example, a fin-type field effect transistor (FinFET). The structure may be used in laterally-diffused metal-oxide semiconductor (LDMOS) device having advantages suitable to radio frequency (RF) applications, such as wireless network power amplifiers. The IC structure includes a semiconductor fin having a first longitudinal extent and a second longitudinal extent. The semiconductor fin has an upper fin portion having a uniform lateral dimension in the first longitudinal extent and the second longitudinal extent, a first subfin portion under the upper fin portion in the first longitudinal extent having a first lateral dimension, and a second subfin portion under the upper fin portion in the second longitudinal extent having a second lateral dimension different than the first lateral dimension, e.g., smaller. Hence, the semiconductor fin has two subfin portions with different lateral dimensions. The subfin portions are within a trench isolation, which may have a bulbous cross-section adjacent the second subfin portion. The second subfin portion reduces the subfin current in the drain extension region of an LDMOS FinFET, and thus improves HCI reliability, regardless of the type of LDMOS device.

FIGS. 1-10 are illustrations of a method of forming an integrated circuit (IC) structure 100 (FIGS. 9 and 10) and an LDMOS device 104, 204 (FIGS. 9 and 10), according to various embodiments of the disclosure. For purposes of description, IC structure 100 may be implemented as part of a FinFET 102 (FIGS. 9 and 10) in the form of LDMOS device 104, 204 (FIGS. 9 and 10, respectively), i.e., a fin-type LDMOS device. As will be described, embodiments of the disclosure can be applied to any variety of FinFET LDMOS device, including FinFET LDMOS-STI and FinFET LDMOS-DP devices. It is emphasized that the teachings of the disclosure can also be applied in other types of MOS devices.

FIG. 1 shows a schematic plan view of a general layout of an IC structure for the purposes of describing embodiments of the disclosure. FIG. 1 includes a set of view lines A-A, B-B, and C-C that will be referenced for purposes of describing the disclosure. FIG. 1 shows a semiconductor fin 110 (actually four fins) extending across the page, and a metal gate structure 112 (two parts in this example) extending across semiconductor fin(s) 110. View line A-A is across an area 114 (noted by a rectangular box) where a longitudinal extent 118 of semiconductor fin(s) 110 has a subfin portion (not shown in FIG. 1) that has a different lateral dimension (i.e., smaller) than a subfin portion in another longitudinal extent 116 of semiconductor fin 110. View line B-B is across semiconductor fin(s) 110 outside of area 114 in which semiconductor fin(s) 110 do not have the different lateral dimensioned subfin portion, i.e., where the subfin portion has its regular lateral dimension. View line C-C is a cross-sectional view across a semiconductor fin 110, see FIG. 9. For any particular stage of the method, a drawing number indicates the particular stage, the drawing with the 'A' notation is across view line A-A showing longitudinal extent 118, and the drawing with the 'B' notation is across view line B-B showing any longitudinal extent 116. It is noted, as shown in FIG. 1, the drawings with the 'B' notation showing longitudinal extent 116 may be of structure of semiconductor fins 110 on either side of the longitudinal extent 118. A 'C' notation is not used with the drawings as it is not necessary.

FIGS. 2A-8B show cross-sectional views of forming a semiconductor fin 110, according to embodiments of the disclosure. Semiconductor fin(s) 110 have a first longitudinal extent 116 (in drawings with 'A' notation) and a second longitudinal extent 118 (in drawings with 'B' notation). As will be described, semiconductor fin(s) 110 will eventually have an upper fin portion having a uniform lateral dimension in first and second longitudinal extents 116, 118, a first subfin portion under the upper fin portion in first longitudinal extent 116 having a first lateral dimension, and a second subfin portion under the upper fin portion in second longitudinal extent 118 having a second lateral dimension different than the first lateral dimension, e.g., smaller. As used herein, "lateral" dimension indicates a dimension in a non-vertical perpendicular direction to the longitudinal or long axis of the fin. As used herein, "subfin portion" refers to a lower portion of a semiconductor fin that is to be located within a trench isolation.

Referring to FIGS. 2A-2B, a hard mask 120 is formed over a (bulk) semiconductor substrate 122. Hard mask 120 may include any now known or later developed mask material layer(s) such as medium temperature oxide (MTO) and silicon nitride. Hard mask 120 is patterned to form one or more semiconductor fin(s) 110 (FIGS. 8A-8B), i.e., it includes openings therein to direct etching of semiconductor substrate 122 to form the fins. Semiconductor substrate 122 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

FIGS. 2A-2B also show cross-sectional views of forming a pair of trenches 124 into semiconductor substrate 122 to a first depth D1. Pair of trenches 124 create semiconductor fin 110 therebetween. It is understood that any number of trenches 124 can be created to form any number of semiconductor fins 110. In contrast to conventional processing, first depth D1 is not to a depth of a complete semiconductor fin 110. First depth D1 is selected, as will be described herein, to be a depth at which an upper portion of a subfin having the different lateral dimension is to be positioned. Trenches 124 may be formed by etching. Hard mask 120 patterning and trench 124 etching may be selected to define an upper fin portion 126 having a uniform lateral dimension ULD in first and second longitudinal extents 116, 118. That is, upper fin portion 126 of semiconductor fin 110 (FIG. 1) has a consistent lateral dimension regardless of position along its length.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases that approach the wafer approximately from one direction, and therefore this process is highly anisotropic. Reactive-ion etching (RIE) operates under conditions intermediate between sputter and plasma etching and may be used to produce deep, narrow features, such as trenches 124.

FIGS. 3A-3B show cross-sectional views of forming a first mask 130 over second longitudinal extent 118, leaving first longitudinal extent 116 exposed. First mask 130 may include any now known or later developed masking material, e.g., a spin-on hardmask (SOH). FIGS. 3A-3B also show etching pair of trenches 124 in first longitudinal extent 116 to a second depth D2 deeper than first depth D1 (FIGS. 2A-2B), creating first subfin portion 132 with a first lateral dimension LD1. Second depth D2 is selected to be a depth to which a 'regular' subfin portion would extend. First lateral dimension LD1 may be commensurate in dimension to that of upper fin portion 126, i.e., it is similar to that expected had the fin been etched in a single step.

FIGS. 4A-4B show cross-sectional views of removing first mask 130 over second longitudinal extent 118. First mask 130 may be removed using any appropriate ashing process and wet stripping process. FIGS. 4A-4B also show forming a spacer layer 134 over first and second longitudinal extents 116, 118. Spacer layer 134 may include any now known or later developed spacer material such as but not limited to silicon nitride. Spacer layer 134 may be formed by depositing. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, spacer layer 134 may be deposited, for example, by ALD. As will be described, spacer layer 134 will also be used to create a collar 136 (FIG. 5A).

FIGS. 5A-5B show cross-sectional views of forming a second mask 140 over first longitudinal extent 116, leaving second longitudinal extent 118 exposed. Second mask 140 may include any now known or later developed masking material, e.g., a spin-on hardmask (SOH). FIG. 5A shows etching pair of trenches 124 in second longitudinal extent 118 to a third depth D3 deeper than first depth D1 (FIGS. 2A-2B). Third depth D3 may be more or less deep than second depth D2 (FIG. 3B). The etching creates a collar 136 from spacer layer 134 that subsequently protects upper fin portion 126 in second longitudinal extent 118. The etching can include any appropriate anisotropic etching chemistry.

FIG. 6A shows a cross-sectional view of further etching of pair of trenches 124 in second longitudinal extent 118 to widen pair of trenches 124 and create second subfin portion 142 with second lateral dimension LD2 less than first lateral dimension LD1 (FIG. 3B). Second lateral dimension is also less than uniform lateral dimension ULD of upper fin portion 126. As shown in FIG. 6B, semiconductor fin 110 in first longitudinal 116 extent are unchanged during this process. Hence, semiconductor fin 110 in first longitudinal extent 116 has the form of a regular semiconductor fin, while semiconductor fin 110 in second longitudinal extent 118 has a different lateral dimension (LD2) in its subfin portion 142. As shown in FIG. 6A, trenches 124 enlarged by the additional etching have a lower portion having a bulbous cross-sectional shape that creates the narrow subfin portion 142.

The etching may include any isotropic etching chemistry, and can be controlled, e.g., chemistry, duration, operational parameters, etc., to control a dimension of subfin portion 142.

FIGS. 7A-7B show cross-sectional views after removing second mask 140 (and spacer layer 134) (FIGS. 5B, 6B), e.g., by any appropriate ashing process and wet stripping process. FIGS. 7A-7B also show filling pair of trenches 124 adjacent at least first and second subfin portions 132, 142 with a dielectric 144. As will be described, dielectric 144 eventually creates a trench isolation 146 (FIGS. 8A-8B), such as a shallow trench isolation (STI) between semiconductor fins 110. Dielectric 144 may include any now known or later developed interlayer dielectric. Suitable dielectric materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). In one non-limiting example, dielectric 144 formation may include performing an in-situ steam generation (ISSG) oxidation, polysilicon liner deposition, flowable chemical vapor deposition (FCVD) of dielectric 144, and an anneal to enhance the dielectric material quality. As shown in FIG. 7A, dielectric 144 adjacent second subfin portion 142 has a bulbous cross-sectional shape, i.e., it takes the shape of the lower portion of trenches 124 in second longitudinal extent 118. In contrast, dielectric 144 in first longitudinal extent 116 are as would be normally expected of straight-walled, first subfin portion 132.

FIGS. 8A-8B show cross-sectional views along view lines A-A and B-B, respectively, and FIG. 9 shows a cross-sectional view along view line C-C in FIG. 1. FIGS. 8A-8B partially show a stage after conventional processing such as but not limited to planarization, active region patterning, well implants, semiconductor fin recessing, and junction anneals (not all shown in FIGS. 8A-8B). More particularly, the method may include (shown in final form in FIG. 9), forming a p-well 152 in part of first longitudinal extent 116, forming an n-well 154 in at least second longitudinal extent 118, forming a source region 160 in p-well 152, forming a drain region 162 in n-well 154, and forming a drain extension region 164 in n-well. Second subfin portion 142 (subfin shown by dashed box) is within drain extension region 164. P-well 152 may include a p-type dopant, which may include but is not limited to: boron (B), indium (In) and gallium (Ga); and n-well 154 may include an n-type dopant, which may include but is not limited to: phosphorous (P), arsenic (As), or antimony (Sb). Wells 152, 154 may be formed using any now known or later developed semiconductor doping technique, e.g., ion implantation, in-situ doping. Source/drain regions 160, 162 may be formed using any now known or later developed semiconductor doping technique. For example, source/drain regions 160, 162 may be formed by mask-directed doping by ion implantation followed by an anneal to drive in the dopants. Source/drain regions 160, 162 may be doped with an n-type dopant, e.g., with a higher dopant concentration than n-well 154. As these implanting steps are well known in the art, no additional details are provided. In another example, source/drain regions 160, 162 may be formed by epitaxial growth on semiconductor fin 110, e.g., after formation of semiconductor fin 110 and poly gate, but before replacement metal gate (RMG). Drain extension region 164 extends from an interface 153 between p-well 152 and n-well 154 to drain region 162. After fin recessing, as shown in FIGS. 8A-8B, dielectric 144 creates trench isolation 146 between semiconductor fins 110. Trench isolation 146 in second longitudinal extent 118 is bulbous in cross-section, but is generally straight-walled in first longitudinal extent 116.

FIG. 9 shows a stage after additionally forming a metal gate structure 112 over semiconductor fin(s) 110, e.g., using a replacement metal gate (RMG) processing. In FIG. 9, metal gate structure 112 includes a first, active gate structure 166 over channel 168 in p-well 152, and a second, floating (dummy) gate structure 170 spaced from first gate structure 166 and over drain extension region 164. Each metal gate structure 112 may be made of any now known or later developed gate materials including, e.g., a gate dielectric, a work function metal, and a gate conductor (not all shown). It is understood that additional processing may also be carried out such as but not limited to middle-of-line and back-end-of-line interconnect processing.

Figure 10:
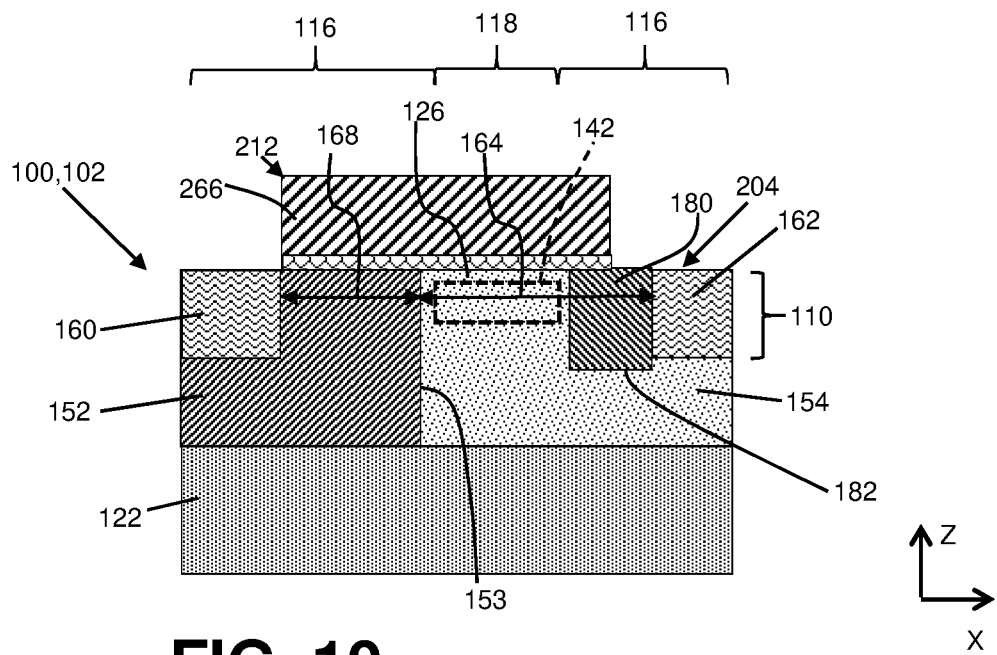
FIG. 10 shows a cross-sectional view of an IC structure, FinFET and LDMOS device, according to other embodiments of the disclosure.

FIG. 9 also shows IC structure 100, FinFET 102 and LDMOS device 104, according to embodiments of the disclosure. FIG. 10 shows a cross-sectional view (similar to view line C-C in FIG. 1) of another embodiment of IC structure 100, FinFET 102 and LDMOS device 204. In this embodiment, gate structure 212 is formed with only a single active gate 266 over channel 168 and drain extension region 164. In addition, the method may further include forming a trench isolation 180 within drain extension region 164 and adjacent to drain region 162 in semiconductor fin 110, i.e., prior to gate structure, well and source/drain region formation. Trench isolation 180 may take any form of any trench isolation structure to electrically isolate active regions. Trench isolation 180 may be formed using any now known or later developed semiconductor fabrication technique. Generally, a trench 182 is etched into semiconductor fin 110, and filled with an insulating material such as oxide, to isolate one region of semiconductor fin 110 from an adjacent region. Trench isolation 180 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Referring to FIGS. 9 and 10, IC structure 100 may include semiconductor fin(s) 110 having first longitudinal extent 116 and second longitudinal extent 118. Semiconductor fin 110 may include a single fin or a plurality of fins. Semiconductor fin 110 also has upper fin portion 126 having uniform lateral dimension ULD (FIGS. 8A-8B) in first longitudinal extent 116 and second longitudinal extent 118. Semiconductor fin 110 also includes first subfin portion 132 under upper fin portion 126 in first longitudinal extent 116 having first lateral dimension LD1, and second subfin portion 142 under upper fin portion 126 in second longitudinal extent 118 having second lateral dimension LD2 different than the first lateral dimension LD1. Second lateral dimension LD2 may be, for example, less than first lateral dimension LD1. As shown in FIG. 8A, second subfin portion 142 may have inwardly curved outer surfaces 184, i.e., due to the bulbous shape of the lower portion of trenches 124 (FIG. 6A). Each subfin portion 132, 142 is within trench isolation 146. As shown in FIG. 8A, trench isolation 146 may have a bulbous cross-sectional shape adjacent second subfin portion 142.

IC structure 100 may be advantageously employed with FinFET LDMOS devices 104, 204 (FIGS. 9 and 10, respectively). LDMOS devices 104, 204 may include p-well 152 in part of first longitudinal extent 116, n-well 154 in at least second longitudinal extent 118, source region 160 in p-well 152, drain region 162 in n-well 154, and drain extension region 164 in n-well 154. Second subfin portion 142 is within drain extension region 164. It is noted that second longitudinal extent 118 and thus second subfin portion 142 is within drain extension region 164, but drain extension region 164 may extend beyond second longitudinal extent 118 and partly into first longitudinal extent 116 (on left in FIGS. 9 and 10). That is, second subfin portion 142 may be within only a portion of drain extension region 164, but a portion of first subfin portion 132 may be within drain extension region 164 (see edges of drain extension region not covered by dashed box in FIGS. 9 and 10). In FIGS. 9 and 10, a first gate structure 166, 266 extends over p-well 152 and n-well 154. LDMOS device 104 in FIG. 9 includes first gate structure 166 and second, floating gate structure 170 over drain extension region 164, i.e., device 104 is an LDMOS-DP device. In contrast, LDMOS device 204 in FIG. 10 includes only first gate structure 266, but includes trench isolation 180 in n-well 154 within drain extension region 164 and adjacent to drain region 162. Each longitudinal extent 116, 118 can be anywhere desired along a length of semiconductor fin 110. In an LDMOS device 104, 204, however, second longitudinal extent 118 may be located within drain extension region 164.

During operation of FinFET LDMOS devices 104, 204, narrower subfin portion 142 within drain extension region 164 reduces current in second subfin portion 142 to improve LDMOS HCI, e.g., for wireless network power amplifier applications. That is, current flow through second subfin portion 142 is less than a subfin current flow in a conventional LDMOS device designed with a single lateral dimension, i.e., with first subfin portion 132 within drain extension region 164, due to second lateral dimension LD2 (FIG. 8A) being smaller than first lateral dimension LD1 (FIG. 8B). Consequently, IC structure 100 provides a 20%-30% smaller impact ionization rate with a smaller depletion region, and a larger potential drop through n-well 154. Hence, IC structure 100 with narrower subfin portion 142 improves HCI reliability, regardless of the type of LDMOS device.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:
1. An integrated circuit (IC) structure, comprising:
a semiconductor substrate;
a semiconductor fin over the semiconductor substrate, the semiconductor fin having a first longitudinal extent and a second longitudinal extent, the semiconductor fin having:
an upper fin portion having a uniform lateral dimension in the first longitudinal extent and the second longitudinal extent, a first subfin portion under the upper fin portion in the first longitudinal extent having a first lateral dimension, and a second subfin portion under the upper fin portion in the second longitudinal extent having a second lateral dimension different than the first lateral dimension, wherein the second subfin portion and the semiconductor substrate include a same material composition.

2. The IC structure of claim 1, wherein the second lateral dimension is less than the first lateral dimension.

3. The IC structure of claim 2, wherein the second subfin portion has inwardly curved outer surfaces.

4. The IC structure of claim 1, wherein each subfin portion is within a trench isolation, wherein the trench isolation has a bulbous cross-sectional shape adjacent the second subfin portion.

5. The IC structure of claim 1, wherein the second subfin portion is within a drain extension region of a fin-type laterally-diffused metal oxide semiconductor (LDMOS) device.

6. The IC structure of claim 5, wherein a portion of the first subfin portion is within the drain extension region.

7. The IC structure of claim 5, wherein the LDMOS device includes a first gate structure over the semiconductor fin and a second, floating gate structure over the drain extension region.

8. The IC structure of claim 5, wherein the LDMOS device includes a trench isolation in an n-well within the drain extension region and adjacent to the drain region.

9. The IC structure of claim 1, wherein the semiconductor fin includes a plurality of fins.

10. A fin-type field effect transistor (FinFET) laterally-diffused metal-oxide semiconductor (LDMOS) device, comprising:
   a semiconductor substrate;
   a semiconductor fin, over the semiconductor substrate, the semiconductor fin having a first longitudinal extent and a second longitudinal extent, the semiconductor fin having:
      an upper fin portion having a uniform lateral dimension in the first longitudinal extent and the second longitudinal extent,
      a first subfin portion under the upper fin portion in the first longitudinal extent having a first lateral dimension, and
      a second subfin portion under the upper fin portion in the second longitudinal extent having a second lateral dimension different than the first lateral dimension, wherein the semiconductor substrate narrows to the second lateral dimension within the second subfin portion;
   a p-well in part of the first longitudinal extent;
   an n-well in at least the second longitudinal extent;
   a source region in the p-well;
   a drain region in the n-well;
   a drain extension region in the n-well, wherein the second subfin portion is within the drain extension region; and
   a first gate structure extending over the p-well and n-well.

11. The FinFET LDMOS device of claim 10, wherein the second lateral dimension is less than the first lateral dimension.

12. The FinFET LDMOS device of claim 10, wherein the second subfin portion has inwardly curved outer surfaces.

13. The FinFET LDMOS device of claim 10, wherein each subfin portion is within a trench isolation, wherein the trench isolation has a bulbous cross-sectional shape adjacent the second subfin portion.

14. The FinFET LDMOS device of claim 10, wherein a portion of the first subfin portion is within the drain extension region.

15. The FinFET LDMOS device of claim 10, further comprising a second, floating gate structure spaced from the first gate structure, wherein the second, floating gate structure is over the drain extension region.

16. The FinFET LDMOS device of claim 10, further comprising a trench isolation in the n-well within the drain extension region and adjacent to the drain region.

17. A method, comprising:
   forming a semiconductor fin within a semiconductor substrate and having a first longitudinal extent and a second longitudinal extent, the semiconductor fin having:
      an upper fin portion having a uniform lateral dimension in the first longitudinal extent and the second longitudinal extent,
      a first subfin portion under the upper fin portion in the first longitudinal extent having a first lateral dimension, and
      a second subfin portion under the upper fin portion and in the second longitudinal extent, the second subfin portion having a second lateral dimension different than the first lateral dimension, and wherein the second subfin portion and the semiconductor substrate include a same material composition; and
   forming a metal gate structure over the semiconductor fin.

18. The method of claim 17, wherein forming the semiconductor fin includes:
   forming a pair of trenches into a substrate to a first depth, the pair of trenches creating the semiconductor fin therebetween;
   forming a first mask over the second longitudinal extent, leaving the first longitudinal extent exposed;
   etching the pair of trenches in the first longitudinal extent to a second depth deeper than the first depth, creating the first subfin portion with the first lateral dimension;
   removing the first mask over the second longitudinal extent;
   forming a spacer layer over the first and second longitudinal extents;
   forming a second mask over the first longitudinal extent, leaving the second longitudinal extent exposed;
   etching the pair of trenches in the second longitudinal extent to a third depth deeper than the first depth;
   etching the pair of trenches in the second longitudinal extent to widen the pair of trenches and create the second subfin portion with the second lateral dimension less than the first lateral dimension;
   removing the second mask; and
   filling the pair of trenches adjacent the first and second subfin portions with a dielectric.

19. The method of claim 18, wherein the dielectric adjacent the second subfin portion has a bulbous cross-sectional shape.

20. The method of claim 17, further comprising, prior to forming the metal gate structure:
   forming a p-well in part of the first longitudinal extent;
   forming an n-well in at least the second longitudinal extent;
   forming a source region in the p-well;
   forming a drain region in the n-well; and forming a drain extension region in the n-well,
wherein the second subfin portion is within the drain extension region.

* * * * *